United States Patent
Jakobsson et al.

(10) Patent No.: US 11,290,077 B2
(45) Date of Patent: Mar. 29, 2022

(54) AGC CONTROLLED TAPERING FOR AN AAS RADIO

(71) Applicant: Telefonaktiebolaget LM Ericsson (publ), Stockholm (SE)

(72) Inventors: Peter Jakobsson, Lund (SE); Lars Lennartsson, Sjöbo (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

(21) Appl. No.: 17/057,316

(22) PCT Filed: Jun. 8, 2018

(86) PCT No.: PCT/EP2018/065238
§ 371 (c)(1),
(2) Date: Nov. 20, 2020

(87) PCT Pub. No.: WO2019/233612
PCT Pub. Date: Dec. 12, 2019

(65) Prior Publication Data
US 2021/0203297 A1 Jul. 1, 2021

(51) Int. Cl.
*H03G 3/30* (2006.01)
*H03F 3/19* (2006.01)
(Continued)

(52) U.S. Cl.
CPC ............. *H03G 3/3036* (2013.01); *H03F 3/19* (2013.01); *H04B 1/12* (2013.01); *H04B 1/16* (2013.01);
(Continued)

(58) Field of Classification Search
CPC ........... H03G 3/3036; H03G 2201/103; H03G 2201/307; H03G 3/3068; H03G 3/3052;
(Continued)

(56) References Cited

U.S. PATENT DOCUMENTS

| 4,870,424 A | 9/1989 | Lalezari et al. |
| 5,017,928 A | 5/1991 | Haupt et al. |

(Continued)

FOREIGN PATENT DOCUMENTS

WO 2016003341 A1 1/2016

OTHER PUBLICATIONS

MATLAB & SIMULINK, "Tapering, Thinning and Arrays with Different Sensor Patterns", obtained on Apr. 16, 2018, pp. 1-14, obtained from Internet: https://se.mathworks.com/help/phased/examples/tapering-thinning-and-arrays-with-different-sensor-patterns.html, Mathworks.

(Continued)

*Primary Examiner* — Dac V Ha
(74) *Attorney, Agent, or Firm* — Coats & Bennett, PLLC

(57) ABSTRACT

A receiver (100) with an antenna array (150) provides interference reduction for blocking signals received by the receiver (100) by controlling different receiver blocks (110) associated with different antenna elements (112) of the array (150) differently, particularly for those antenna elements (112) in the corner or proximate a corner or edge of the array (150), responsive to a power level of a combined signal resulting from all antenna elements (112). As a result, the solution presented herein enables a receiver (100) to more accurately target the gain control such that the antenna elements (112) and associated receiver circuitry (110) most likely to be impacted by unwanted signals have a reduced gain, while the antenna elements (112) and associated receiver circuitry (110) less likely to be impacted by unwanted signals can operate with a higher gain.

30 Claims, 18 Drawing Sheets

(51) Int. Cl.
*H04B 1/12* (2006.01)
*H04B 1/16* (2006.01)

(52) U.S. Cl.
CPC ............... *H03G 2201/103* (2013.01); *H03G 2201/307* (2013.01)

(58) Field of Classification Search
CPC .... H03F 3/19; H04B 1/12; H04B 1/16; H04B 7/0857
See application file for complete search history.

(56) References Cited

U.S. PATENT DOCUMENTS

| | | | |
|---|---|---|---|
| 11,158,940 B2* | 10/2021 | Rafique | H04B 17/21 |
| 11,177,567 B2* | 11/2021 | Khalil | H04B 17/19 |
| 2002/0103013 A1 | 8/2002 | Watson et al. | |
| 2004/0157645 A1 | 8/2004 | Smith et al. | |
| 2018/0115064 A1 | 4/2018 | Safavi-Naeini et al. | |
| 2018/0269579 A1* | 9/2018 | Bartone | H01Q 9/045 |
| 2021/0050668 A1* | 2/2021 | Ota | H01Q 3/36 |

OTHER PUBLICATIONS

3rd Generation Partnership Project, "3rd Generation Partnership Project; Technical Specification Group Radio Access Network; NR; Base Station (BS) radio transmission and reception (Release 15)", Technical Specification, 3GPP TS 38.104 V15.1.0, Mar. 1, 2018, pp. 1-133, 3GPP, France.

Afsari, A., et al., "Session 9 Overview: High-Performance Wireless", Wireless Subcommittee overview, Digest of Technical Papers, ISSCC 2016, Session 9, Jan. 1, 2016, pp. 162-180, IEEE.

* cited by examiner

AGC CONTROLLED TAPERING FOR AN AAS RADIO

TECHNICAL FIELD

The solution(s) presented herein generally relate to antenna control, and more particularly relate to variable antenna control for specific antenna elements.

BACKGROUND

Some 5th Generation (5G) cellular systems use Advanced Antenna Systems (AASs), which comprise a phased-controlled (or a time delay-controlled) array of antennas, to increase capacity and/or coverage for a corresponding cellular system by enabling beamforming of transmitted and received Radio Frequency (RF) signals. Various architectures for AAS include, but are not limited to, analog beamforming, digital beamforming, and hybrid beamforming. With analog beamforming, the RF signal (or the local oscillator signal used for up/down conversion of the wanted signal(s)) is time delayed or phase shifted. With digital beamforming, the wanted signal(s), e.g., Orthogonal Frequency Doman Multiplexing (OFDM) signals, are digitally phase shifted in the time or frequency domain to implement the time delay/phase shift. Hybrid beamforming involves some combination of digital and analog beamforming. It will be appreciated that while each architecture requires analog-to-digital conversion, the number of Analog-to-Digital Converters (ADCs) varies depending on the architecture. For example, some implementations of analog beamforming combine the received analog signals before converting the combined signal to a digital format, while implementations of digital beamforming may convert each received signal in the AAS to a digital signal with a dedicated ADC before implementing the time/phase shift, and then subsequently combine the digital signal in the time or frequency domain.

Receivers, including those using an AAS, typically use power control to control the power of a received signal. For example, a base transceiver station (BTS) may measures the power of the received signal, and send an up or down command to the transmitting device, e.g., a User Equipment (UE), to force the transmitting device to increase or decrease its transmitting power. This type of power control works well when all of the signals received by the BTS are associated with devices served by that BTS. When the BTS receives signals from UE(s) it does not serve, e.g., UE(s) served by a BTS owned by a different operator, the BTS typically cannot control the transmitting power of these "uncoordinated UEs." As such, the uncoordinated UEs may create interfering signals that cannot be controlled via traditional power control techniques.

One conventional solution to this problem takes advantage of the fact that the unwanted signals (e.g., from the uncoordinated UEs) are typically on different frequencies than the wanted signals. Thus, the BTS may use one or more filters to filter out the unwanted signals. Because such filtering requires a steep filter response, the BTS typically implements such filtering in the digital domain.

In some instances, the combined signal power of the wanted and unwanted signals may overwhelm the receiver. For example, the combined signal power may be larger than the dynamic range of the ADC used to convert the combined analog signal to a combined digital signal. In such cases, the BTS may automatically reduce the receiver gain for all received signals, e.g., for each antenna element of the AAS, until the combined signal power falls to an acceptable level, e.g., below the dynamic range of the ADC. Because the combined signal may include both wanted and unwanted signals, such receiver gain reduction not only reduces the power of the unwanted signals, but also of the wanted signals, and thus increases the noise figure/degrades the signal-to-noise ratio for the wanted signals. Thus, there remains a need for improved interference suppression and/or gain control, particularly in the presence of unwanted interference signals from uncoordinated UEs.

SUMMARY

The solution presented herein provides different receiver control for different antenna elements of an array antenna, particularly for those antenna elements in the corner or proximate a corner or edge of the array, to reduce the impacts of interference caused by unwanted signals. As a result, the solution presented herein enables a receiver to more accurately target the gain control such that the antenna elements and associated receiver circuitry most likely to be impacted by unwanted signals have a reduced gain, while the antenna elements and associated receiver circuitry less likely to be impacted by unwanted signals can operate with a higher gain. As such, the solution presented herein improves the SNR, and thus the Bit Error Rate (BER) and/or Block Error Rate (BLER), for the wanted signal(s).

In one exemplary embodiment, a receiver configured to receive one or more wireless signals from one or more wireless devices via an antenna array comprising a plurality of antenna elements including a plurality of edge antenna elements at one or more outer edges of the antenna array comprises a plurality of receiver block circuits, a combiner, a gain control circuit, and an interference control circuit. Each of the plurality of receiver block circuits comprises an antenna element of the antenna array and a variable gain amplifier. The variable gain amplifier is configured to amplify a signal received by the corresponding antenna element to generate an amplified signal. The combiner is configured to combine the amplified signals output by the plurality of receiver block circuits to generate a combined signal. The gain control circuit is configured to set a gain for each of the variable gain amplifiers responsive to the combined signal. The interference control circuit is configured to control each receiver block circuit in a set of edge receiver block circuits responsive to the combined signal. The set of edge receiver block circuits comprises one or more receiver block circuits with at least one edge antenna element. The set of edge receiver block circuits comprises fewer than the plurality of receiver block circuits. In some exemplary embodiments, the receiver is comprised in a wireless device. Exemplary wireless devices include, but are not limited to, a mobile station, a machine-to-machine device, and a network node.

Another exemplary embodiment comprises a method of receiving one or more wireless signals from one or more wireless devices via an antenna array comprising a plurality of antenna elements including a plurality of edge antenna elements at one or more of the outer edges of the antenna array. The method comprises processing a signal with a plurality of receiver block circuits by, for each receiver block circuit receiving the signal by an antenna element of the antenna array and amplifying the received signal using a variable gain amplifier to generate an amplified signal. The method further comprises combining the amplified signals output by the plurality of receiver block circuits using a combiner to generate a combined signal and setting a gain, using a gain control circuit, for each of the variable gain amplifiers responsive to the combined signal. The method further comprises controlling the processing of each receiver block circuit in a set of edge receiver block circuits responsive to the combined signal. The set of edge receiver block circuits comprises one or more receiver block circuits with at least one edge antenna element. The set of edge receiver block circuits comprises fewer than the plurality of receiver block circuits.

Some exemplary embodiments comprise a computer program product for controlling a receiver. The computer program product comprises software instructions which, when run on at least one processing circuit in the receiver, causes the receiver to execute the claimed method.

DETAILED DESCRIPTION

The solution presented herein addresses problems caused by unwanted signals received by a receiver utilizing an antenna array to enable the receiver to better detect wanted signals. A network node, e.g., a base transceiver station (BTS), owned by a particular operator, e.g., "operator A," is typically assigned one sub-band of a spectrum. As such, devices in the network served by a particular BTS transmit signals in that BTS's assigned sub-band at a power controlled by the serving BTS. Various forms of interference may interfere with the BTS's ability to receive and/or detect the wanted signals. For example, other devices in the network served by a different BTS, e.g., a BTS owned by "operator B" may transmitting signals in another sub-band of the spectrum that interfere with the wanted signals at the serving BTS. Such devices are referred to herein as "uncoordinated devices" or "blocking devices," and their transmitted signals are interchangeably referred to herein as "blocking signals" or "unwanted signals" because they typically interfere with and/or block the reception of the wanted signals.

While various filtering options may be used to remove such unwanted signals, some circumstances cause the unwanted signals to overload the receiver, resulting in an undesirable decrease in the receiver gain. For example, if the sum of the wanted signal(s) and the blocking signal(s) becomes larger than the dynamic range of the analog-to-digital converter(s) (ADC) of the receiver, the receiver may automatically reduce the gain of the receiver until the analog part of the receiver once again outputs a signal at a desirable level, e.g., below the dynamic range of the ADC. This problem also applies when the BTS includes an AAS using angular beamforming, where the impact of the interference depends not only on the distance between the blocking device and the receiver, but also on the angle of arrival of the blocking signal. Because the gain reduction implemented by the receiver applies equally to all branches of the receiver (and thus to all signals received by all antenna elements of an array antenna), conventional receiver gain reduction techniques result in a higher receiver noise figure (NF), particularly when the reason for the gain reduction is the presence of blocking signal(s). An increased NF results in a degraded SNR for the wanted signal, which results in higher Bit Error Rates/Block Error Rates (BERs/BLERs).

Figure 1:
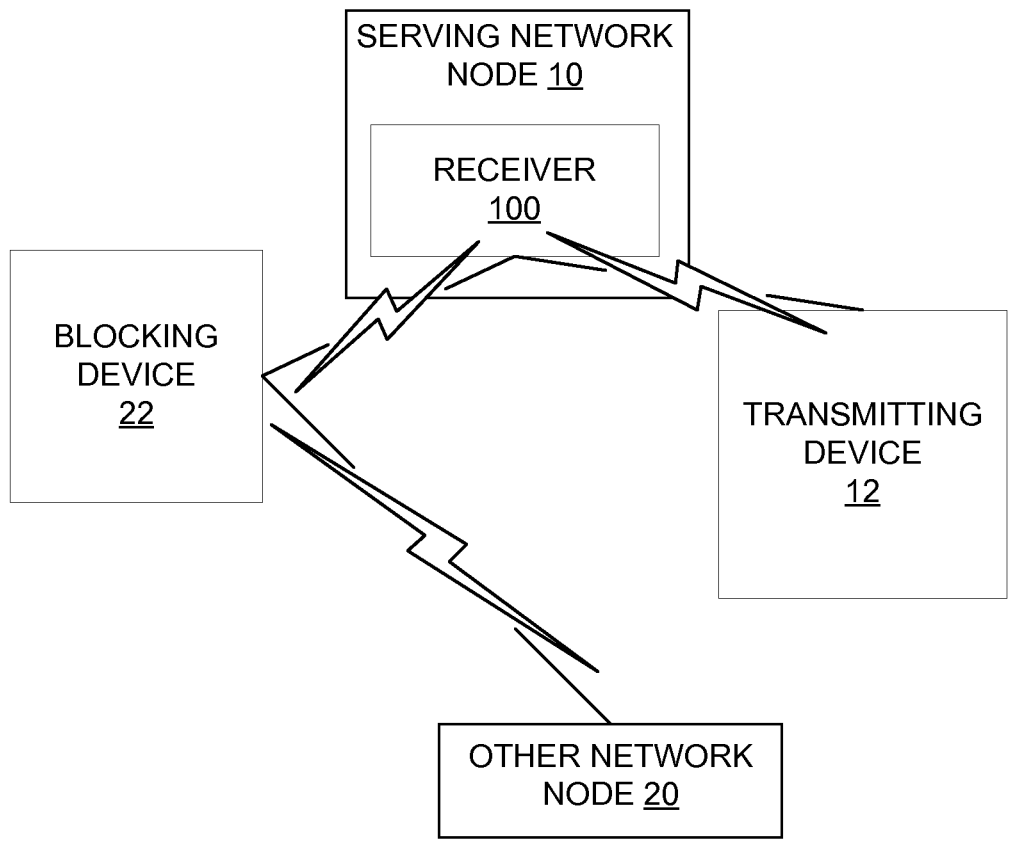
FIG. 1 shows a block diagram of a wireless network comprising a local area base station according to one exemplary embodiment.
Figure 2:
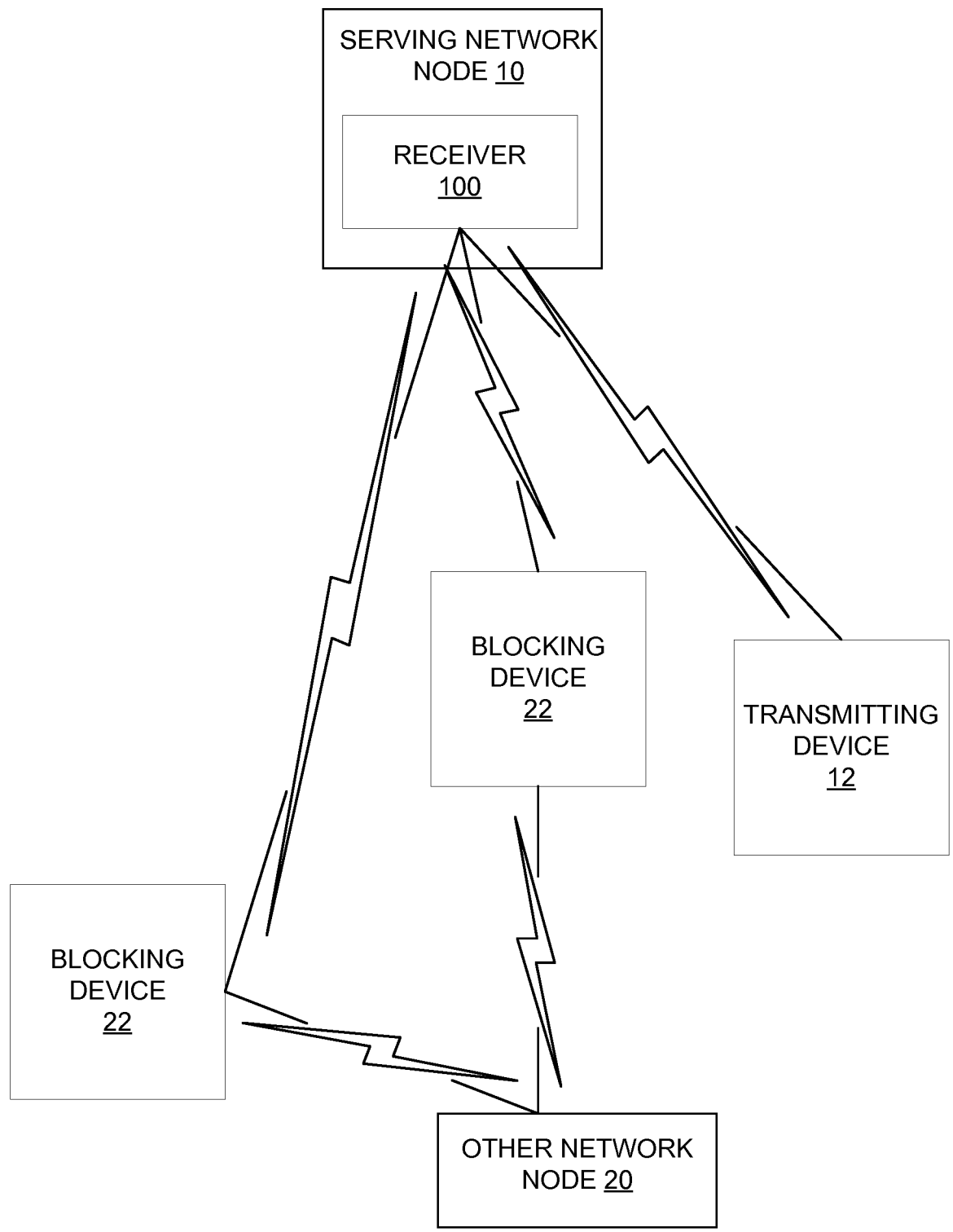
FIG. 2 shows a block diagram of a wireless network comprising a wide area/medium range base station according to one exemplary embodiment.

FIGS. 1 and 2 show block diagrams for two exemplary scenarios where one or more blocking devices may overload the receiver 100. As shown in FIGS. 1 and 2, a transmitting device 12 served by a serving network node 10 transmits signals to the receiver 100 in the serving network node 10. Further, a blocking device 22 served by another network node 20, transmits signals to the other network node 20. When the network nodes 10, 20 are owned by different operators and/or operate in different sub-bands of the spectrum, the respective network nodes 10, 20 only control the transmitting power of the devices they serve. Regardless, signals transmitted by the blocking device 22 may still be received by the receiver 100, and thus represent blocking (or interference) signals for the wanted signals transmitted by device 12 and received by the receiver 100.

In FIG. 1, various transmitting devices 12, 22 may come in close proximity to the serving node 10, e.g., when the serving network node 10 is a local area BTS, also referred to as a pico BTS, e.g., BTSs implemented indoors. As such, the receiver 100 of the serving network node 10 will receive wanted signals from a transmitting device 12 as well as unwanted signals from a blocking device 22 served by a different network node 20, both of which may be very close to the receiver 100. When a blocking device 22 comes close to the receiver 100, the receiver 100 may detect a combination of the wanted and unwanted signals, producing a signal with an undesirably large power, e.g., a power exceeding the dynamic range of the ADC. Typically, such local area BTSs receive signals from only a couple devices at a time. As such, for the scenario of FIG. 1, the overloading blocking power typically is the result of a blocking signal from a single blocking device 22, which necessarily has one angle of arrival at the receiver 100.

FIG. 2 shows a scenario where the various transmitting devices 12, 22 are relatively far from the serving node, e.g., at least 5 m. Exemplary serving network nodes 10 for this scenario include but are not limited to a "medium range BTS" or a "wide area BTS," which are also referred to herein as a micro/macro BTS, e.g., BTSs implemented at street level. Due to the larger distance between the receiver 100 and the transmitting devices 12, 22, the total blocking power may be the result of transmissions from multiple blocking devices 22 served by node 20. As a result, the blocking signals, as well as the wanted signals may arrive at the receiver 100 from multiple angles. While FIG. 2 shows only one transmitting device 12 and two blocking devices 22, it will be appreciated that the node 10 of FIG. 2 may serve any number of transmitting devices 12 and may receive signals from any number of blocking devices 22.

Figure 3:
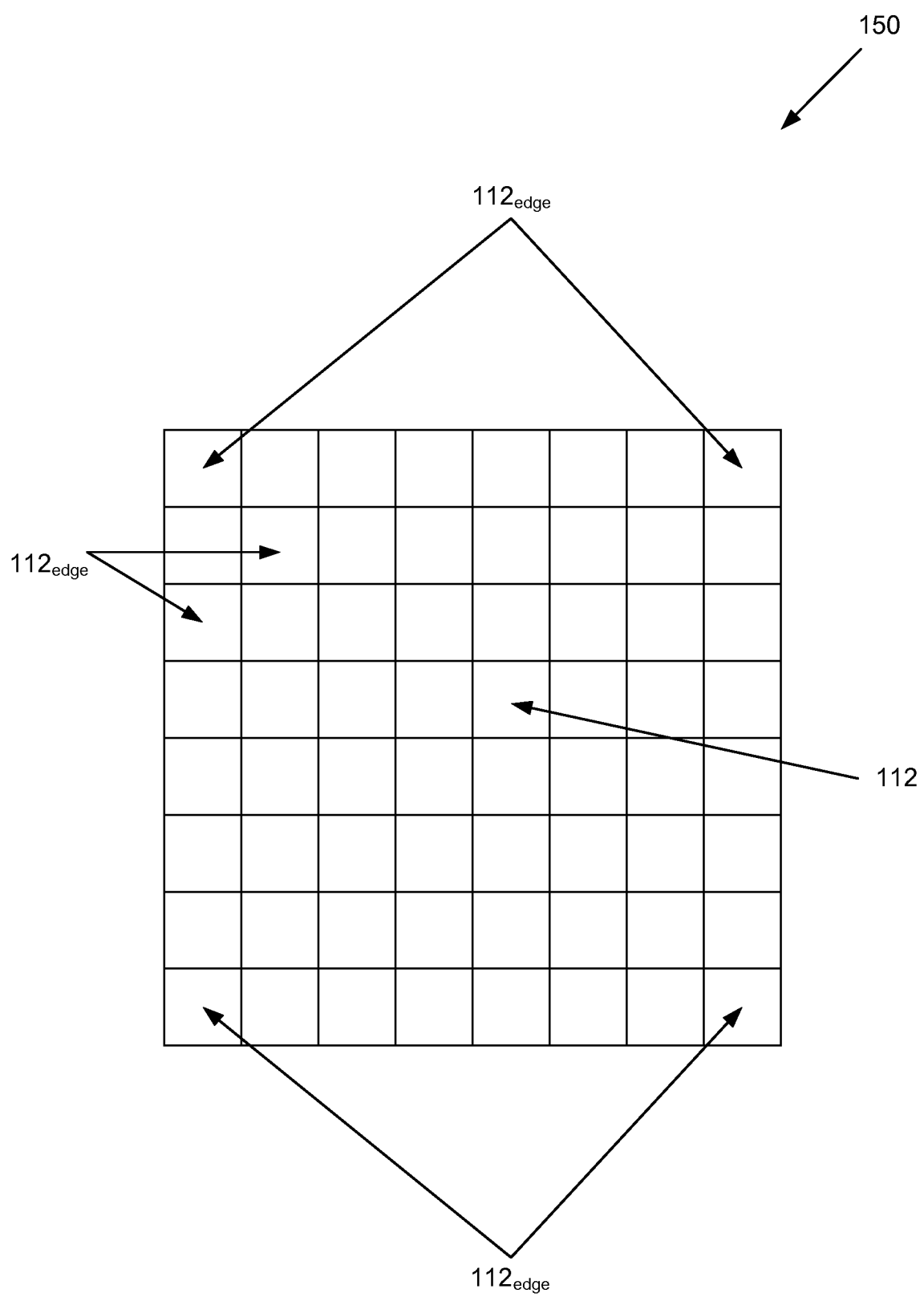
FIG. 3 shows an antenna array comprising a plurality of antenna elements according to one exemplary embodiment.

Because different types of network nodes experience interference from different numbers of blocking devices 22, e.g., as shown in FIGS. 1 and 2, receiver 100 may experience different scenarios of blocking signals (e.g., a single blocking signal from one angle in FIG. 1 vs. multiple blocking signals from multiple angles in FIG. 2). As such, an antenna of the receiver 100 experiences blocking signals from different angles depending on the current circumstances, e.g., the type of BTS operating as the serving node 10 and/or the proximity of the devices 12, 22 relative to the serving network node 10. When the antenna 150 of the receiver 100 is an array antenna, e.g., as shown in FIG. 3, the different angles of arrival of the wanted and unwanted signals hit each antenna element of the array differently, which may cause the unwanted signal power to fall in a sidelobe of the wanted signal spectrum.

The solution presented herein takes advantage of the different angles of arrival for the wanted and unwanted signals at the receiver's antenna array to improve suppression of the unwanted signals in the receiver 100. FIG. 3 shows an exemplary antenna array 150, which comprises a plurality of antenna elements 112 arranged in an orderly fashion, e.g., in a grid. It will be appreciated that some antenna elements 112 in the array 150 are along or proximate an edge of the array 150, including the antenna elements in the corners of the array 150. Each antenna element 112 receives the signals from the transmitting and blocking devices 12, 22 differently, depending on the distance between the devices 12, 22 and the antenna array 150 as well as depending on the relative angle between the devices 12, 22 and each antenna element 112. The solution presented herein exploits this fact to provide a way for receiver 100 to better separate the wanted signals from the blocking signals.

Figure 4:
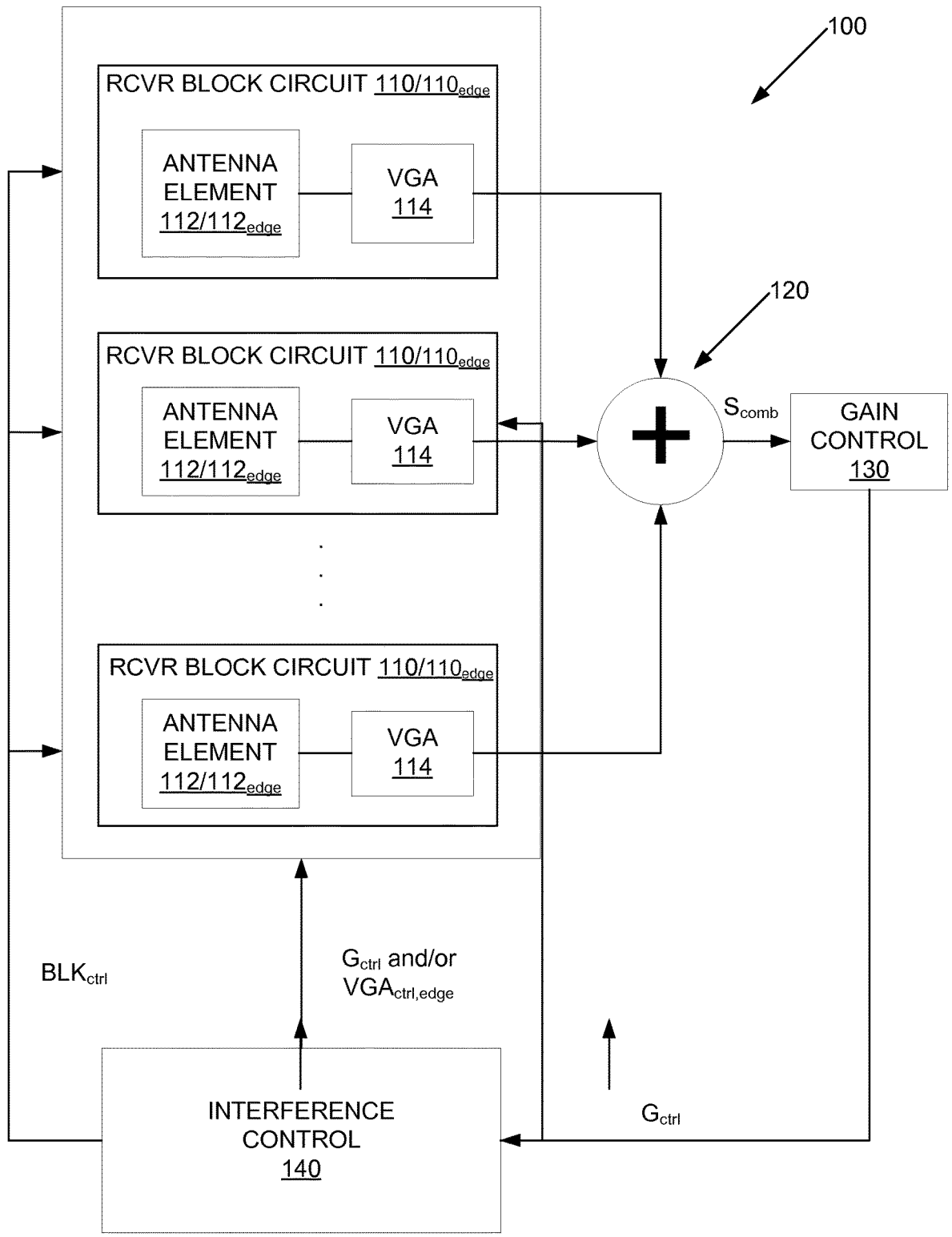
FIG. 4 shows a block diagram of a receiver according to one exemplary embodiment.

FIG. 4 shows a block diagram of a receiver 100 according to exemplary embodiments presented herein. Receiver 100 comprises a plurality of receiver block circuits 110, a combiner 120, a gain control circuit 130, and an interference control circuit 140. Each receiver block circuit 110 comprises one antenna element 112 from antenna array 150 and a Variable Gain Amplifier (VGA) 114. Any receiver block circuit 110 comprising an antenna element 112 designated as an edge antenna element $112_{edge}$, represents an edge receiver block circuit $110_{edge}$. Combiner 120 combines the amplified signals output by each receiver block circuit 110 to generate a combined signal $S_{comb}$. Gain control circuit 130 controls the gain of each receiver block circuit 110, e.g., by controlling the gain of each VGA 114, responsive to the combined signal $S_{comb}$. For example, if the power of the combined signal exceeds a threshold, the gain control circuit 130 may decrease the gain of each VGA 114, while if the power of the combined signal is less than or equal to a threshold, the gain control circuit 130 may increase the gain of each VGA 114. The interference control circuit 140 controls each receiver block circuit 110 in a set of edge receiver block circuits $110_{edge}$ responsive to the combined signal $S_{comb}$ to reduce the presence of the blocking signals in the combined signal without unnecessarily reducing the gain of the wanted signal(s).

Figure 5:
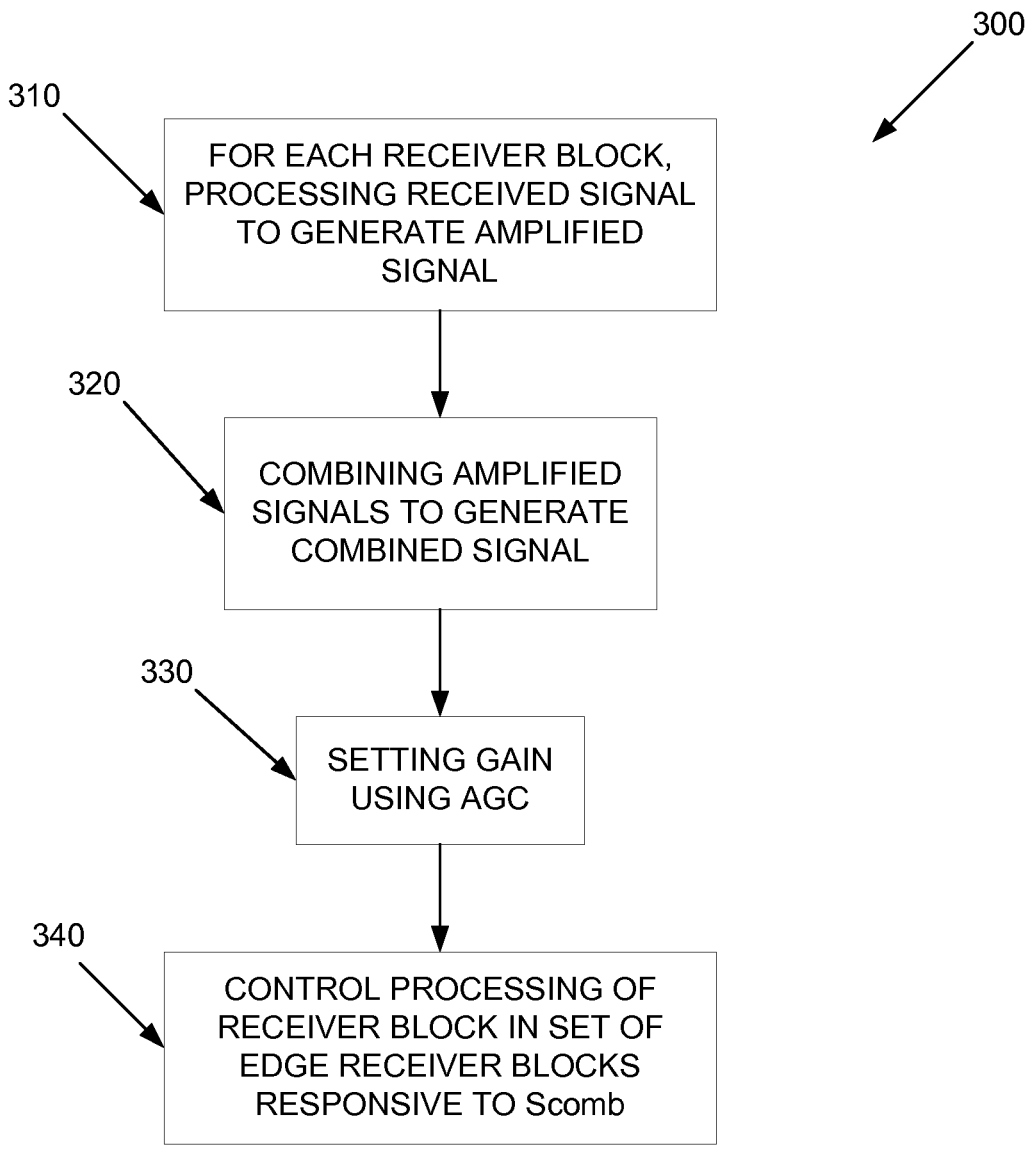
FIG. 5 shows a method for a receiver according to one exemplary embodiment.

FIG. 5 shows a method of receiving wireless signals using receiver 100 according to exemplary embodiments disclosed herein. Each receiver block circuit 110 of the receiver amplifies a received signal to output an amplified signal (block 310), which is subsequently combined to generate a combined signal $S_{comb}$ (block 320). A gain control circuit 130 sets a gain for each variable gain amplifier 114 in the receiver 100 responsive to the combined signal (block 330). The interference control circuit 140 controls the processing of each receiver block circuit in the set of edge receiver block circuits $110_{edge}$ responsive to the combined signal (block 340), where the set of edge receiver block circuits $110_{edge}$ comprise one or more receiver block circuits 110 with at least one edge antenna element $112_{edge}$, and where the set of edge receiver block circuits $110_{edge}$ comprises fewer than all of the receiver block circuits 110.

The set of edge receiver block circuits $110_{edge}$ comprise all of the receiver block circuits 110 designated as edge receiver block circuits $110_{edge}$ for the network node 10. In some embodiments, the set of edge receiver block circuits $110_{edge}$ may be fixed for a particular network node 10. In other embodiments, the network node 10 or another network entity controlling the network node 10 may select the edge receiver block circuits $110_{edge}$ in the set responsive to any number of criteria, e.g., one or more of the location of the network node 10, an expected angle of arrival for wanted and/or blocking signals, a history of the blocking signals previously received by the network node 10, the power of the combined signal, etc. In any case, the set of edge receiver block circuits $110_{edge}$ may comprise the receiver block circuits 110 corresponding to corner antenna elements 112, the receiver block circuits 110 corresponding to antenna elements 112 along an edge of the array 150, and/or the receiver block circuits 110 corresponding to antenna elements 112 proximate the corner antenna elements and/or the antenna elements along the edge of the array 150.

In one exemplary embodiment, interference control circuit 140 controls the edge receiver block circuits $110_{edge}$ by adjusting the gain of the VGA(s) 114 in the edge receiver block circuits $110_{edge}$. For this embodiment, the interference control circuit 140 passes the gain control signal $G_{ctrl}$ output by the gain control circuit 130 to each VGA that is not in an edge receiver block circuit $110_{edge}$, but applies a different gain control $VGA_{ctrl,edge}$ to the VGAs 114 in the edge receiver block circuits $110_{edge}$. For example, the $VGA_{ctrl,edge}$ signal may set the VGAs 114 in the edge receiver block circuits $110_{edge}$ to zero or to some other value lower than the gain set by Gun output by the gain control circuit 130. Alternatively, the $VGA_{ctrl,edge}$ signal may deactivate and/or turn off the power to the VGAs 114 in the edge receiver block circuits $110_{edge}$. In some embodiments, the VGAs 114 in the edge receiver block circuits $110_{edge}$ may be deactivated/turned off using an on/off switch (not shown).

In another exemplary embodiment, the interference control circuit 140 controls the edge receiver block circuits $110_{edge}$ by deactivating the edge antenna elements $112_{edge}$ in each edge receiver block circuit $110_{edge}$. The interference control circuit 140 may deactivate the edge antenna elements $112_{edge}$ by turning off the power (e.g., via an on/off switch (not shown)) and/or steering the edge antenna element $112_{edge}$ away from the signal. Alternatively, the interference control circuit 140 may control the edge receiver block circuits $110_{edge}$ by deactivating any element(s) in the edge receiver block circuits $110_{edge}$.

In another exemplary embodiment, the interference control circuit 140 controls the edge receiver block circuits $110_{edge}$ by applying a tapering pattern to the VGAs 114 in the edge receiver block circuits $110_{edge}$. The tapering pattern defines a tapering, discussed further herein, of the gain set by the gain control circuit 130 for the VGAs 114 in the edge receiver block circuits $110_{edge}$.

Figure 6:
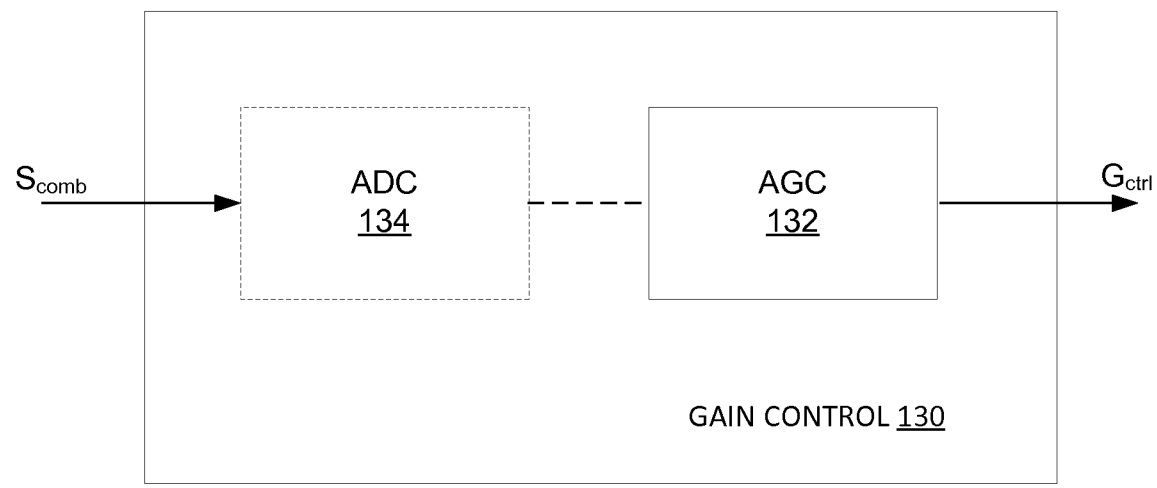
FIG. 6 shows a block diagram of a gain control unit/circuit/module according to one exemplary embodiment.

In one exemplary embodiment, the gain control circuit 130 may comprises an Automatic Gain Control (AGC)

circuit 132, as shown in FIG. 6. AGC 132 outputs the gain control signal $G_{ctrl}$ responsive to the combined signal to control the gain of each VGA 114 in receiver 100 according to any known means. The gain control signal typically defines the same gain level for each VGA 114. In some embodiments, the AGC 132 is a digital circuit, in which case the gain control circuit 130 may further include an analog-to-digital converter (ADC) 134 to digitize the combined signal before passing it to the digital AGC 132.

As noted above, interference control circuit 140 controls the edge receiver block circuits $110_{edge}$ responsive to the combined signal. For example, when $S_{comb}$<T, where T represents a threshold, the interference control circuit 140 may not interfere with the normal operation of the gain control circuit 130 for all receiver block circuits 110. However, when $S_{comb}$>=T, the interference control circuit 140 may control each edge receiver block circuit $110_{edge}$ according to any method disclosed herein to reduce the gain designated by the gain control circuit for some of the receiver block circuits 110, e.g., the edge receiver block circuits $110_{edge}$. In some embodiments, the threshold T may be derived from or responsive to the dynamic range of the ADC 134. In other embodiments, the threshold T may be selected by the serving network node 10 (or other network node associated with the serving network node 10) based on any desired criteria, including but not limited to, historical performance of the receiver 100, historical impact of blocking signals, limiting characteristic(s) of any receiver components, etc.

FIGS. 7-10C show exemplary situations and corresponding simulations for the solution presented herein. For example, FIG. 7A shows an 8×8 antenna array 150, where the signal received by each antenna element 112 is amplified by the corresponding VGA 114 according to normal operations. When a blocking signal is the result of a single blocking device 22, the solution presented herein may control the edge receiver block circuits $110_{edge}$ according to the gain for the edge antenna elements $112_{edge}$ shown in FIG. 7B. In FIG. 7B, the edge receiver block circuits $110_{edge}$ include the edge antenna elements $112_{edge}$ comprising the six antenna elements 112 forming each corner of the array 150. By controlling the edge receiver block circuits $110_{edge}$ differently than the remaining receiver block circuits 110, e.g., by reducing the gain of the edge receiver block circuits $110_{edge}$ to less than that of the remaining receiver block circuits 110, the solution presented herein reduces the sidelobes relative to the peak. Because the blocking signal is in the sidelobes, this sidelobe reduction reduces the blocking signal relative to the wanted signal. For example, reducing the gain of the edge receiver block circuits $110_{edge}$ as shown in FIG. 7B shifts the sidelobes by 45 degrees, and thereby suppress the sidelobes in the position of the blocking signal, as shown in FIG. 8B relative to FIG. 8A.

Figure 7A:
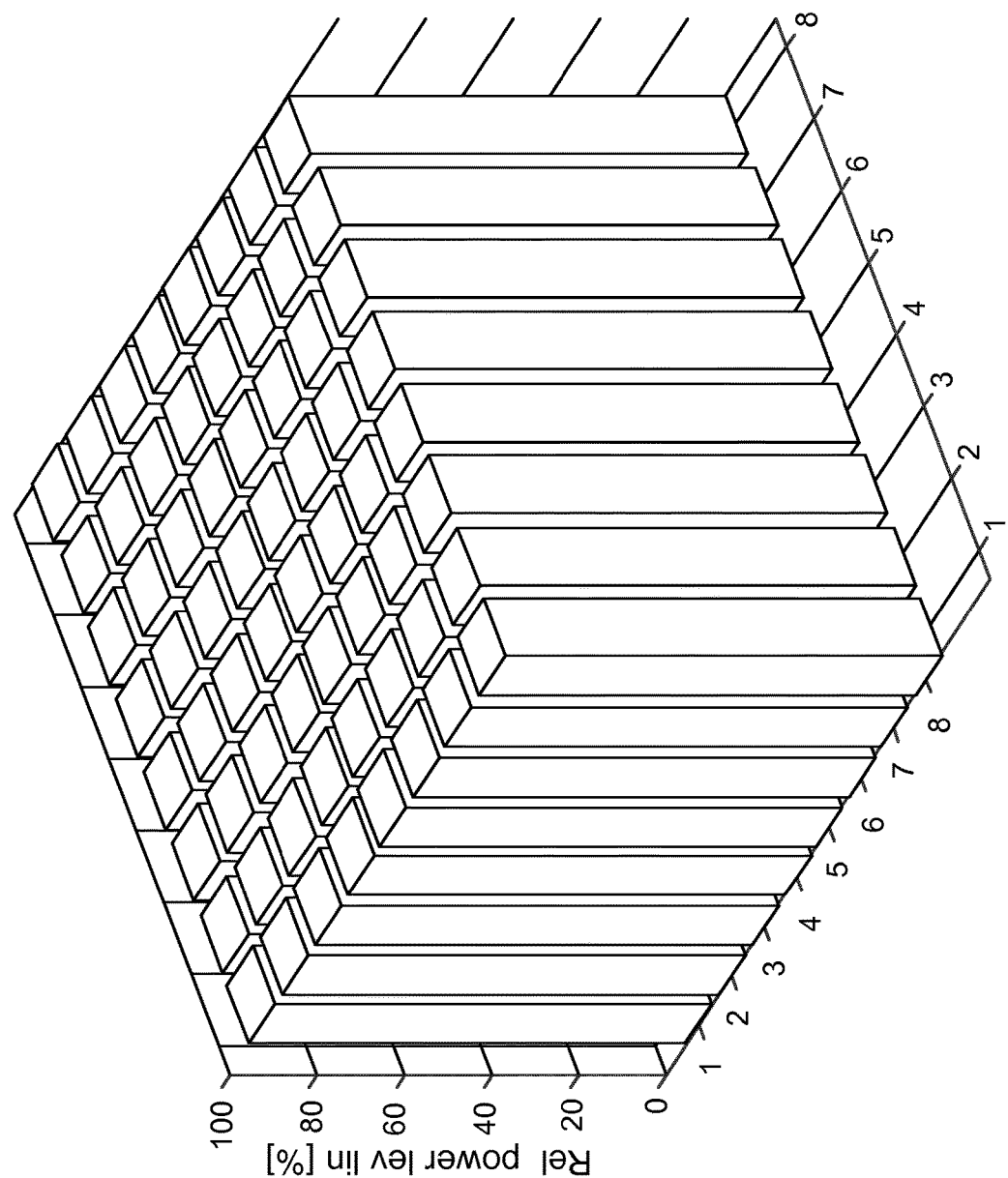
FIGS. 7A-7B show gain control for an antenna array according to one exemplary embodiment.
Figure 7B:
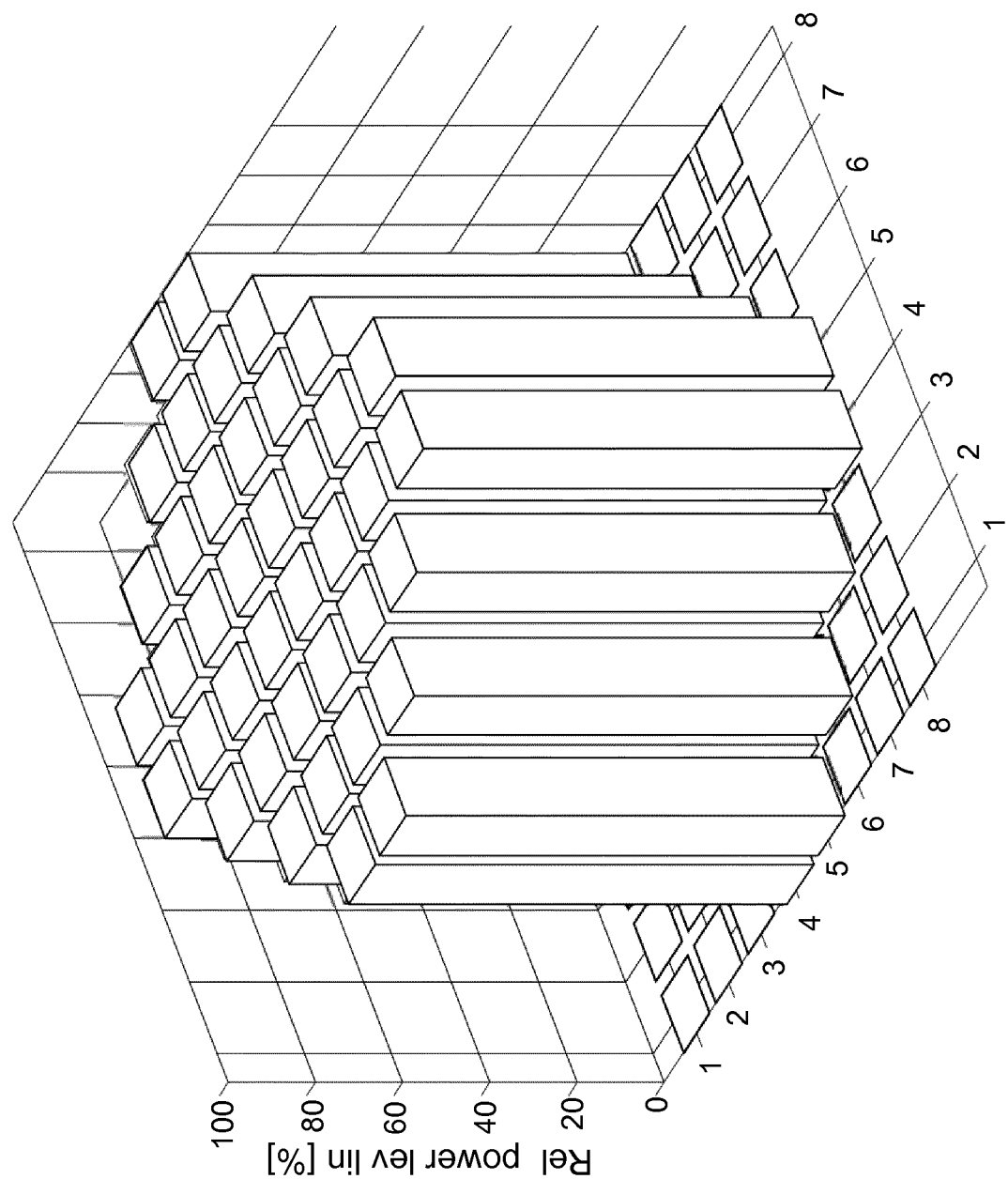
Figure 8A:
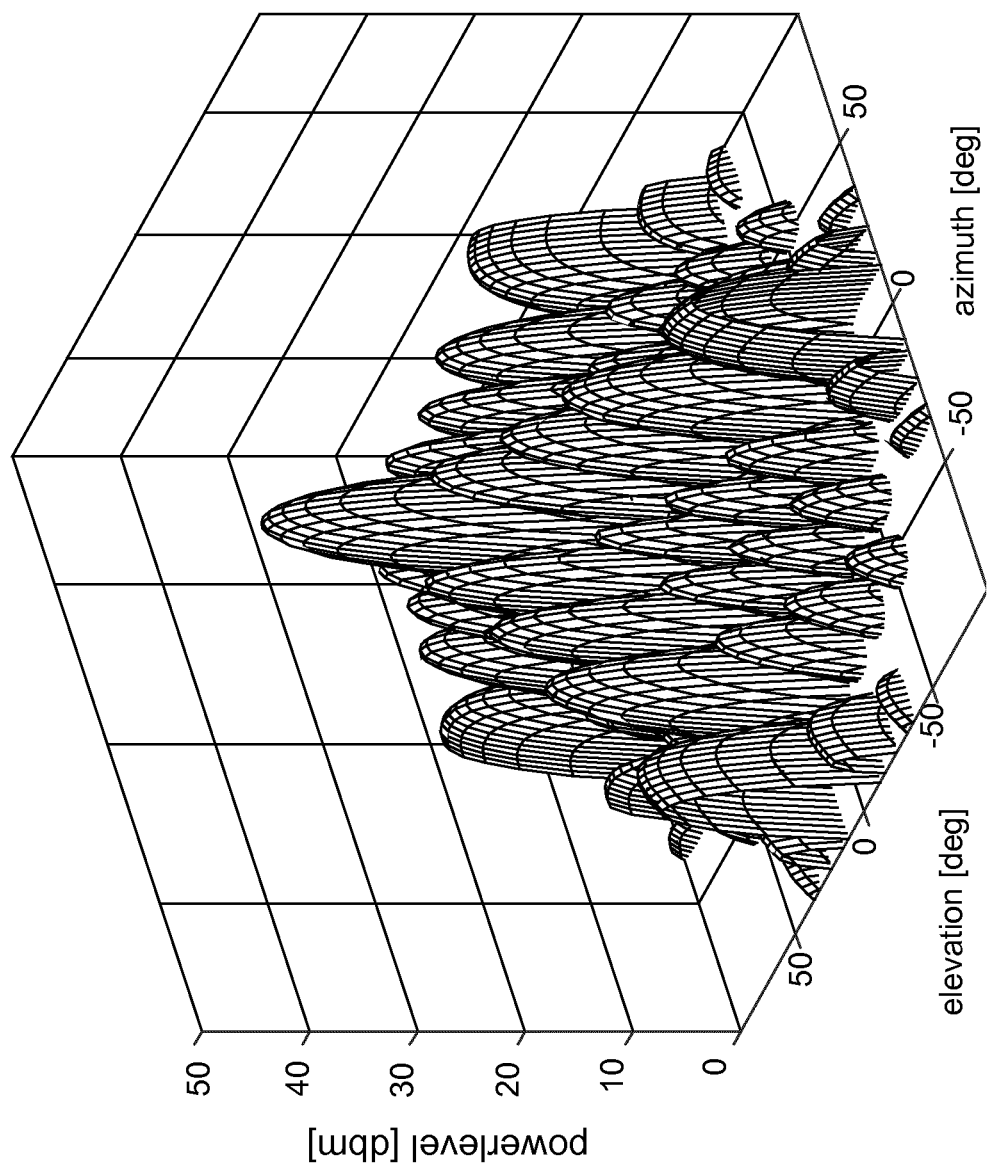
FIGS. 8A-8B show an exemplary radiation pattern resulting from the antenna arrays of FIGS. 7A-7B, respectively.
Figure 8B:
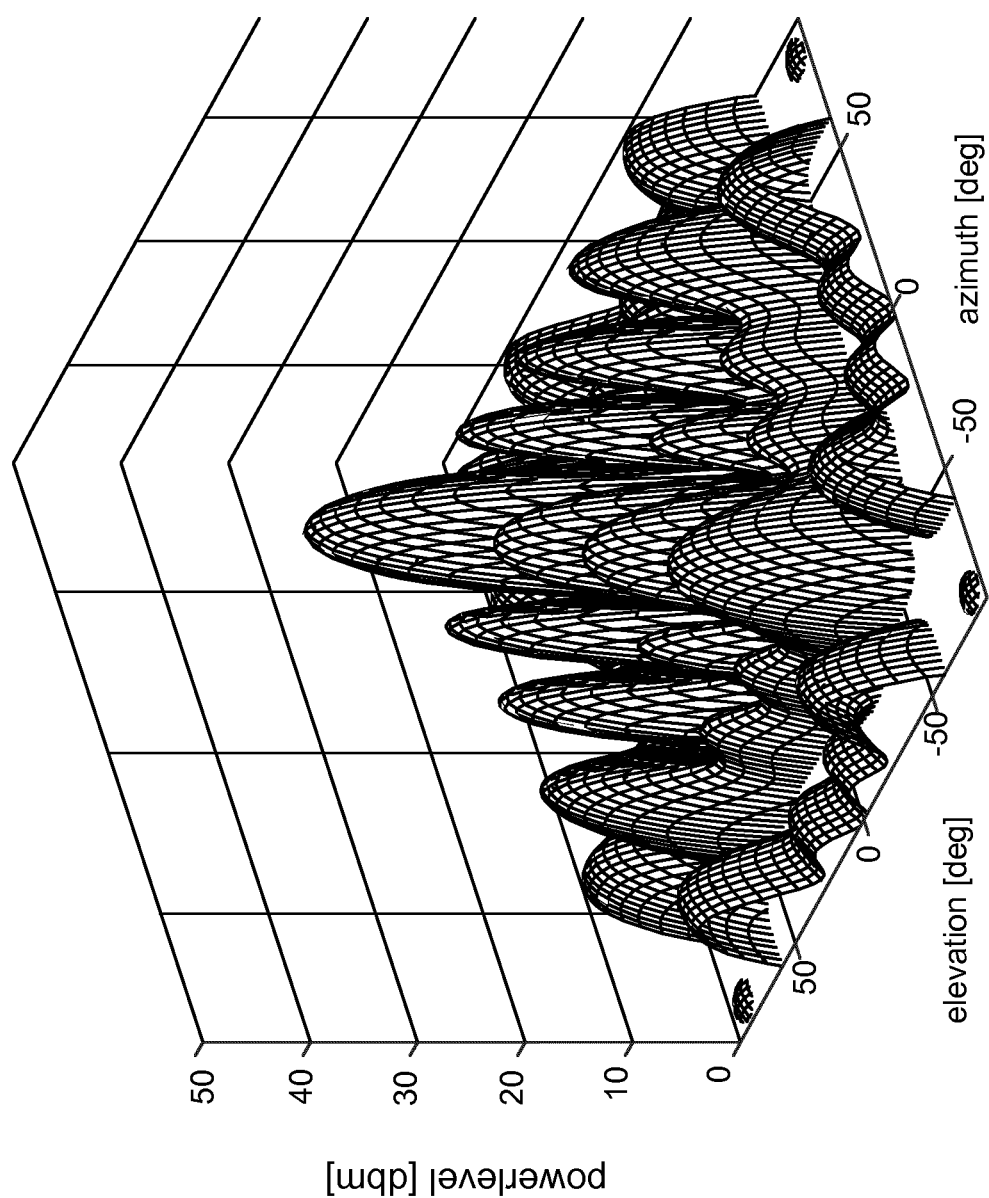

Table 1 shows more results for the example of FIGS. 7A-7B. In particular, Table 1 shows the improvement to the ratio of the wanted signal to the blocking signal when several different gain levels are applied for the edge antenna elements $112_{edge}$ of FIG. 7B. As shown in Table 1, when the gain of the edge receiver block circuits $110_{edge}$ does not change, i.e., when the AGC 132 controls the gain of all receiver block circuits 110 in the same way, there is no improvement in the wanted to blocking signal ratio. A gain for the edge receiver block circuits $110_{edge}$ that is reduced by 3 dB, 6 dB, or 20 dB, however, produces a +2 dB, +4 dB, or +9 dB improvement in the wanted to blocking signal power ratio, respectively, where the wanted signal for each of these reduced gains ends up 1.8 dB, 2.9 dB, or 4 dB closer to the noise floor.

TABLE 1

| Gain Reduction [dB] | In beam gain drop [dB] | Interference gain [dB] | Wanted/interferer improvement[dB] |
|---|---|---|---|
| 0 | 0 | 0 | 0 |
| −3 | 1.8 | 4 | 2.2 |
| −6 | 2.9 | 7 | 4.1 |
| −20 | 4 | 13 | 9 |

The example of FIGS. 7A-7B and 8A-8B represent one preferred embodiment for scenarios where there is one blocking device 22 near the network node 10 that transmits a blocking signal having one angle of arrival at the receiver 100.

Figure 9A:
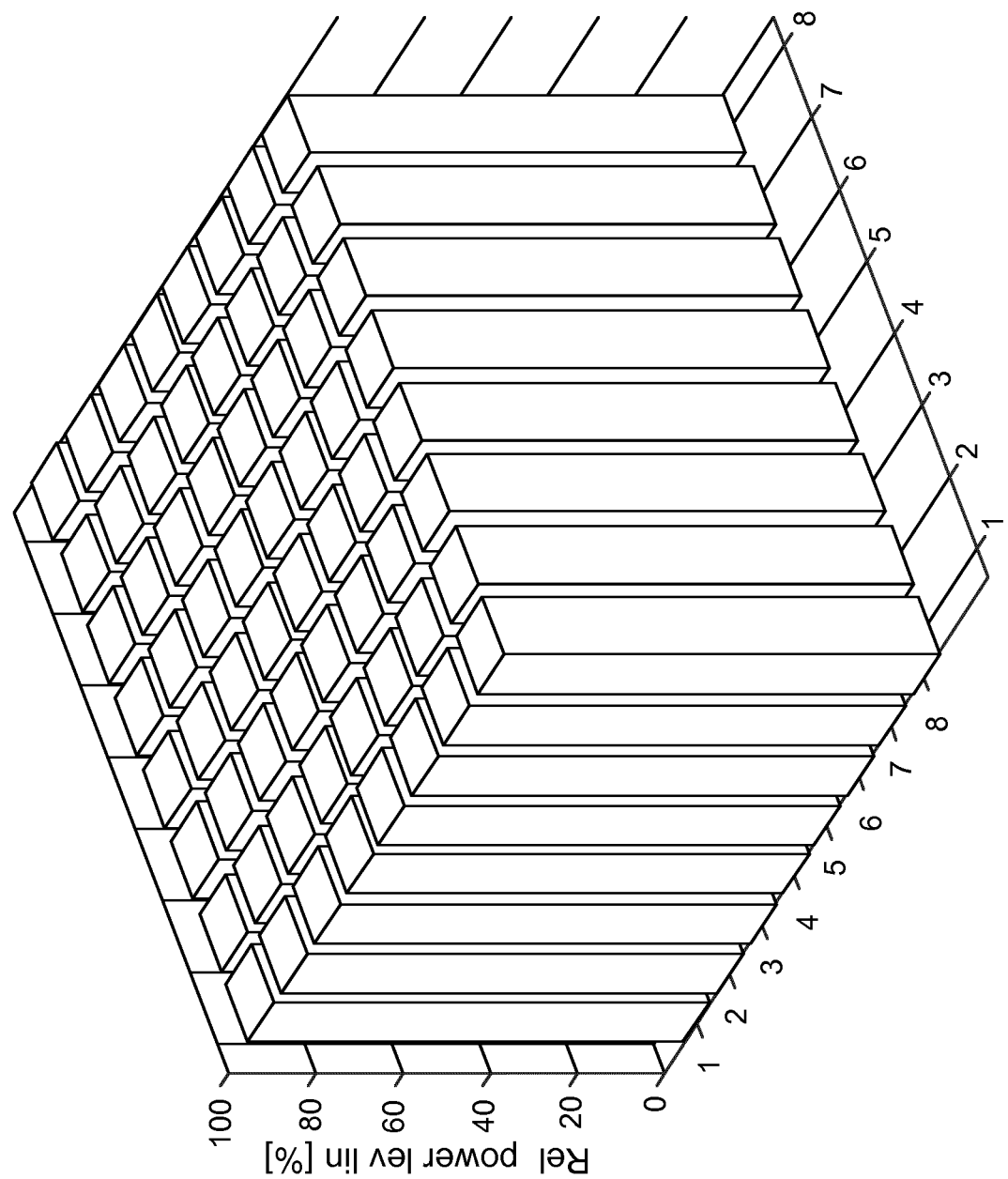
FIGS. 9A-9C show gain control for an antenna array according to another exemplary embodiment.
Figure 9B:
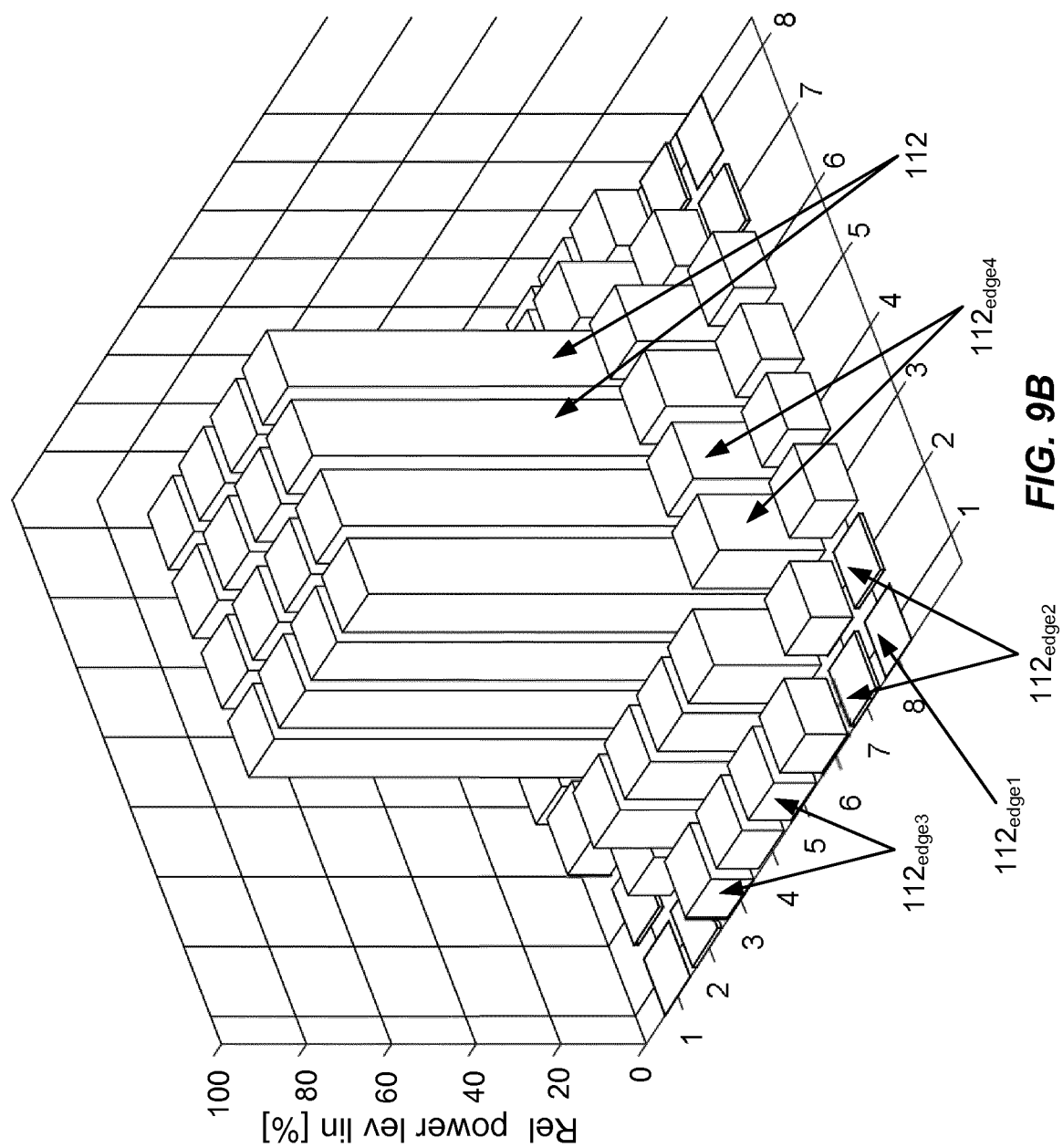
Figure 9C:
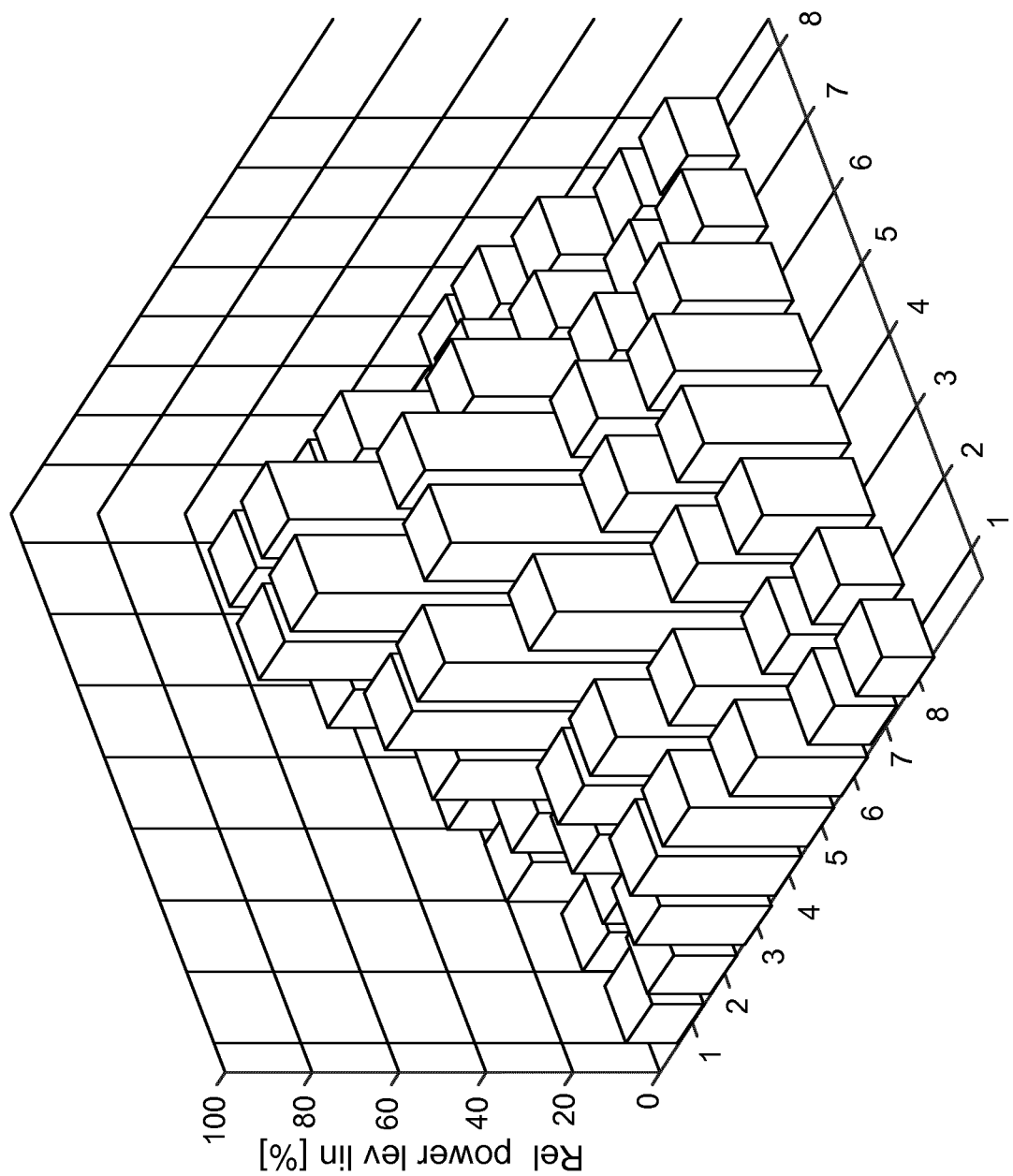
Figure 10A:
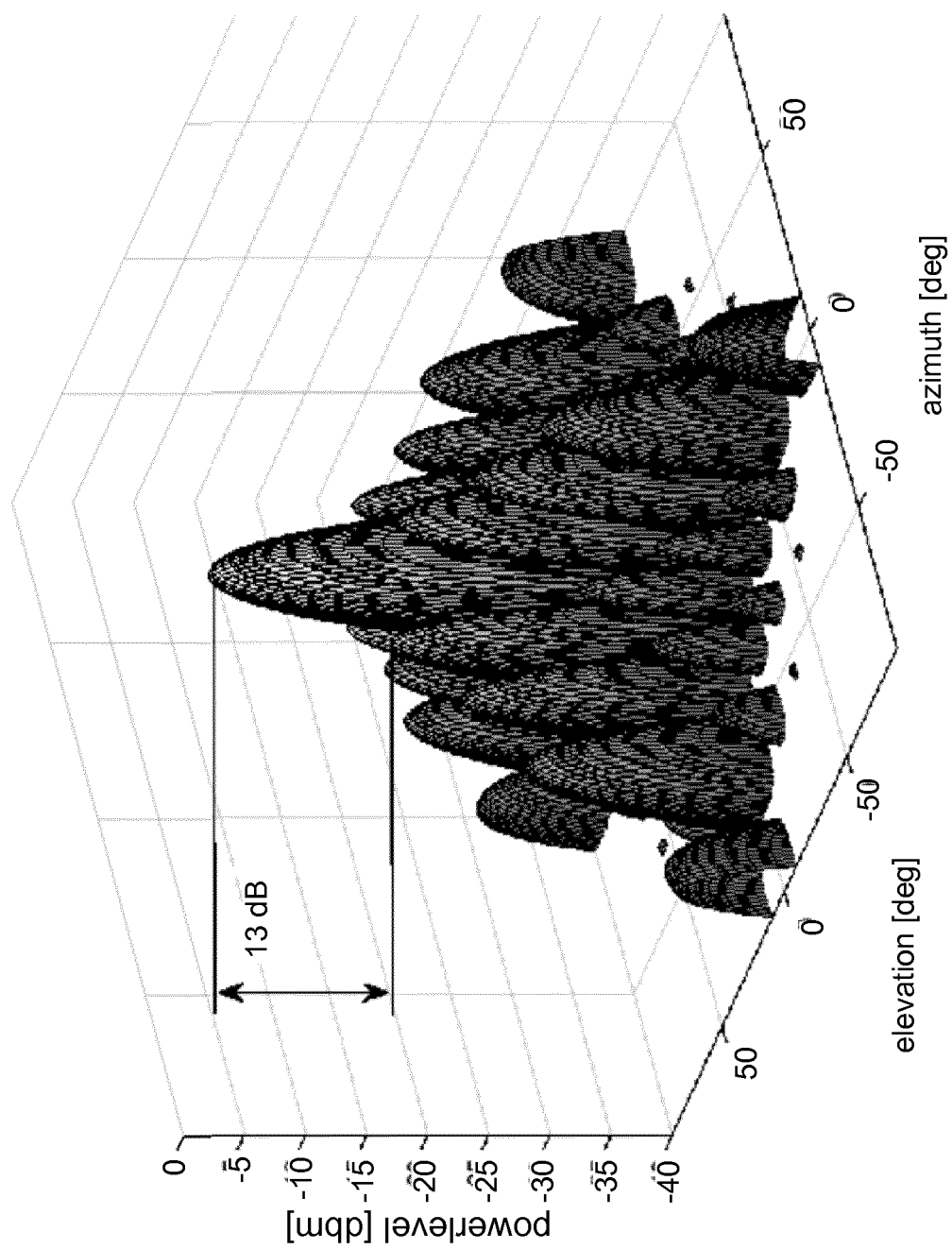
FIGS. 10A-10C show an exemplary power profile resulting from the antenna arrays of FIGS. 9A-9C, respectively.
Figure 10B:
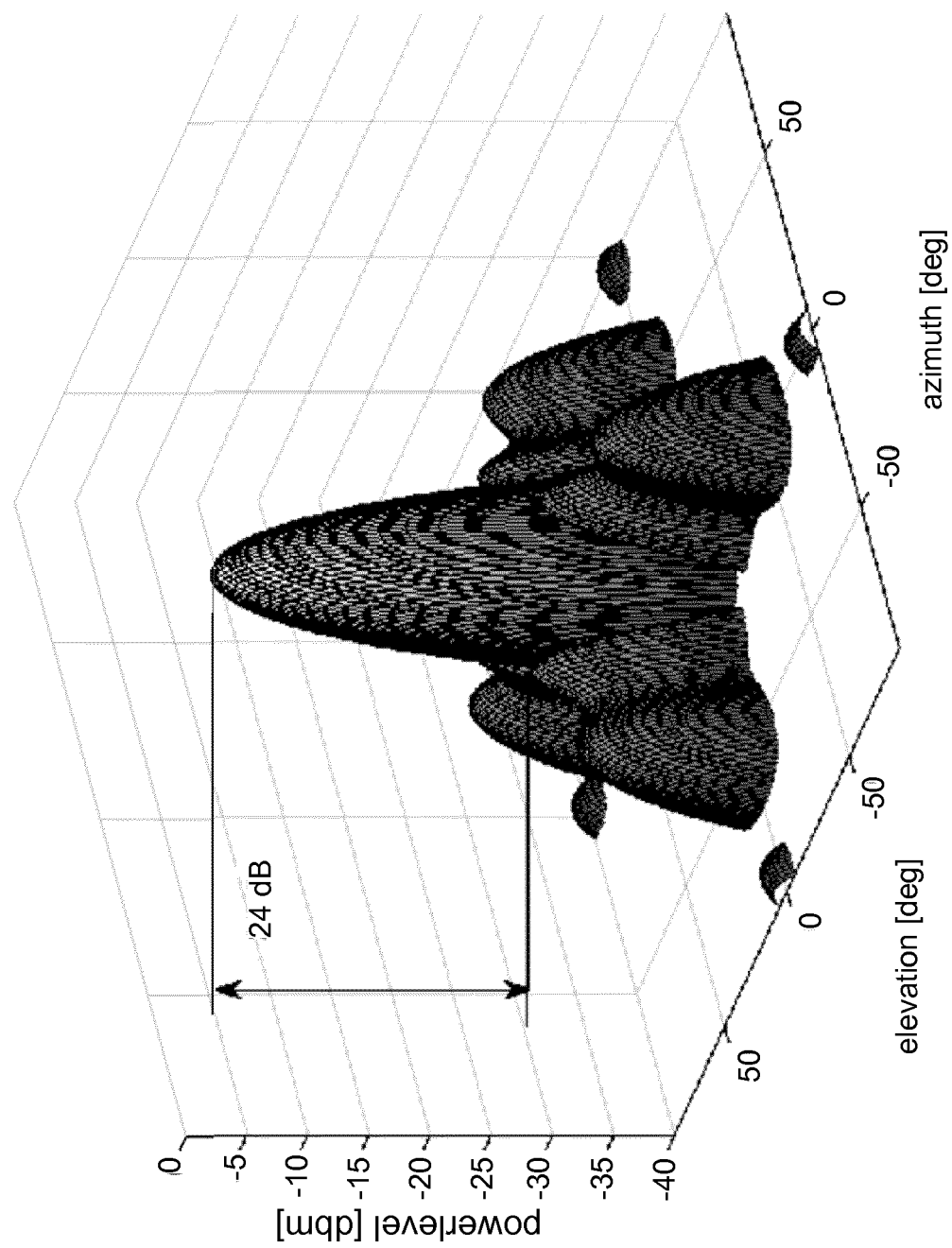
Figure 10C:
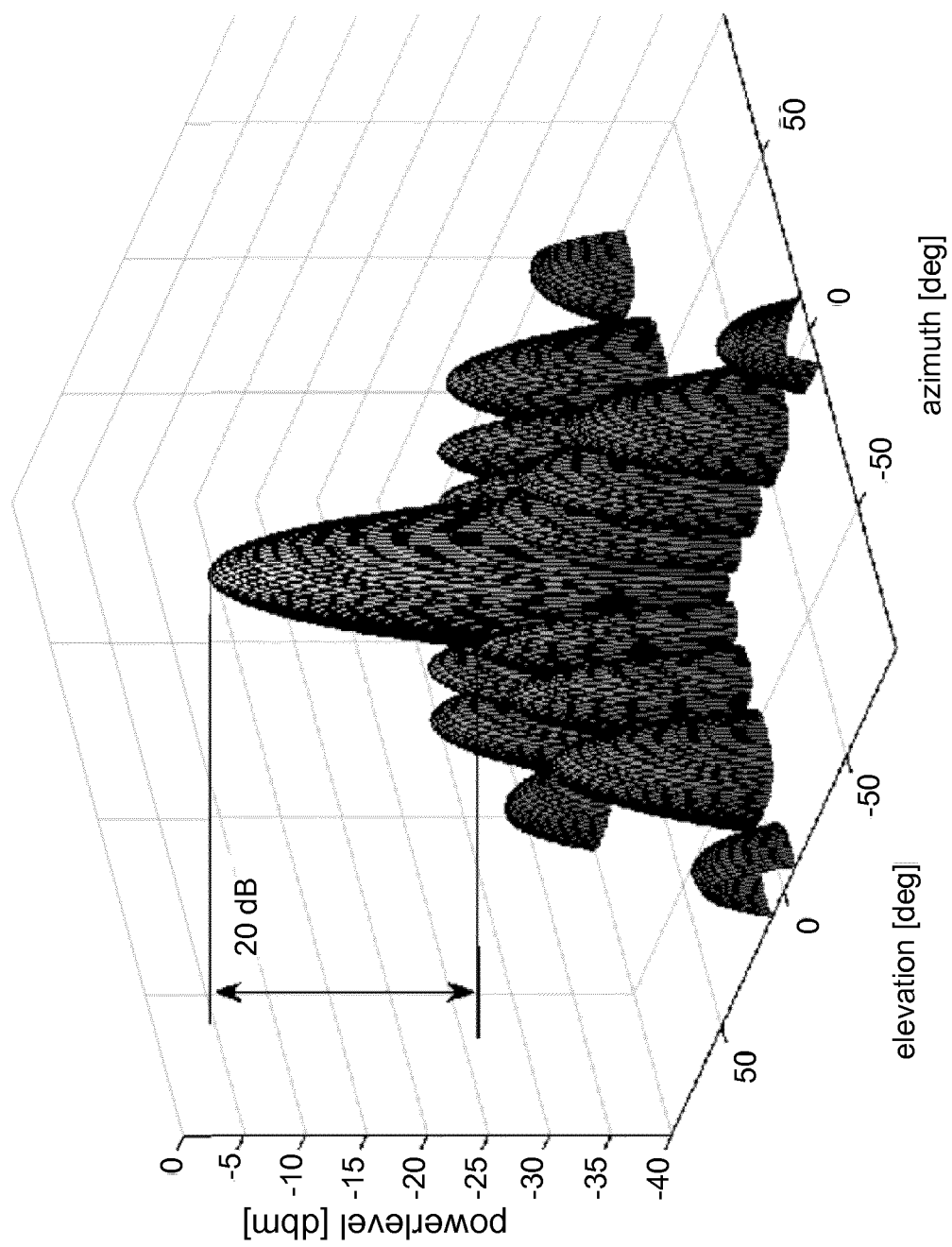

FIGS. 9A-9C show different embodiments, where FIG. 9A shows normal operations for the antenna array 150, while FIGS. 9B and 9C show the use of a tapering pattern to apply different amounts of control for different edge receiver block circuits $110_{edge}$. When multiple blocking signals are in one or more sidelobes of the wanted signal, the solution presented herein may use a tapering pattern to reduce the blocking signals. FIGS. 9B and 9C show exemplary tapering patterns that may be used by receiver 100 to apply different gains to the edge receiver block circuits $110_{edge}$ associated with different subgroups of edge antenna elements $112_{edge}$. For example, the interference control circuit 140 may apply the tapering pattern of FIG. 9B that reduces the gain of FIG. 9A such that a first gain $G_1$ is applied to the corner edge antenna elements $112_{edge1}$, a second gain $G_2$ is applied to the edge antenna elements $112_{edge2}$, a third gain $G_3$ is applied to the edge antenna elements $112_{edge3}$, a fourth gain $G_4$ is applied to the edge antenna elements $112_{edge4}$, and a fifth gain $G_5$ (which is the gain of FIG. 9A) is applied to the remaining antenna elements 112, where $G_1<G_2<G_3<G_4<G_5$. In so doing, the ratio of the wanted signal to the blocking signal improves from the performance shown in FIG. 10A (for FIG. 9A) to the performance shown in FIG. 10B (for FIG. 9B). It will be appreciated that the solution presented herein is not limited to the tapering pattern of FIG. 9B, and that interference control circuit 140 may apply any desired tapering pattern, e.g., the tapering pattern of FIG. 9C, which results in the performance shown in FIG. 10C. The particular tapering pattern applied by the interference control circuit 140 may be selected or otherwise generated depending on the wanted step size of the tapering, the size of the antenna elements 112, and/or the size of the antenna array 150. The example of FIGS. 9A-9C and 10A-10C represent exemplary embodiment for scenarios where there are multiple blocking devices 22 remotely located from the network node 10, e.g., at least 5 m away, where the receiver 100 receives blocking signals from multiple directions.

Figure 11:
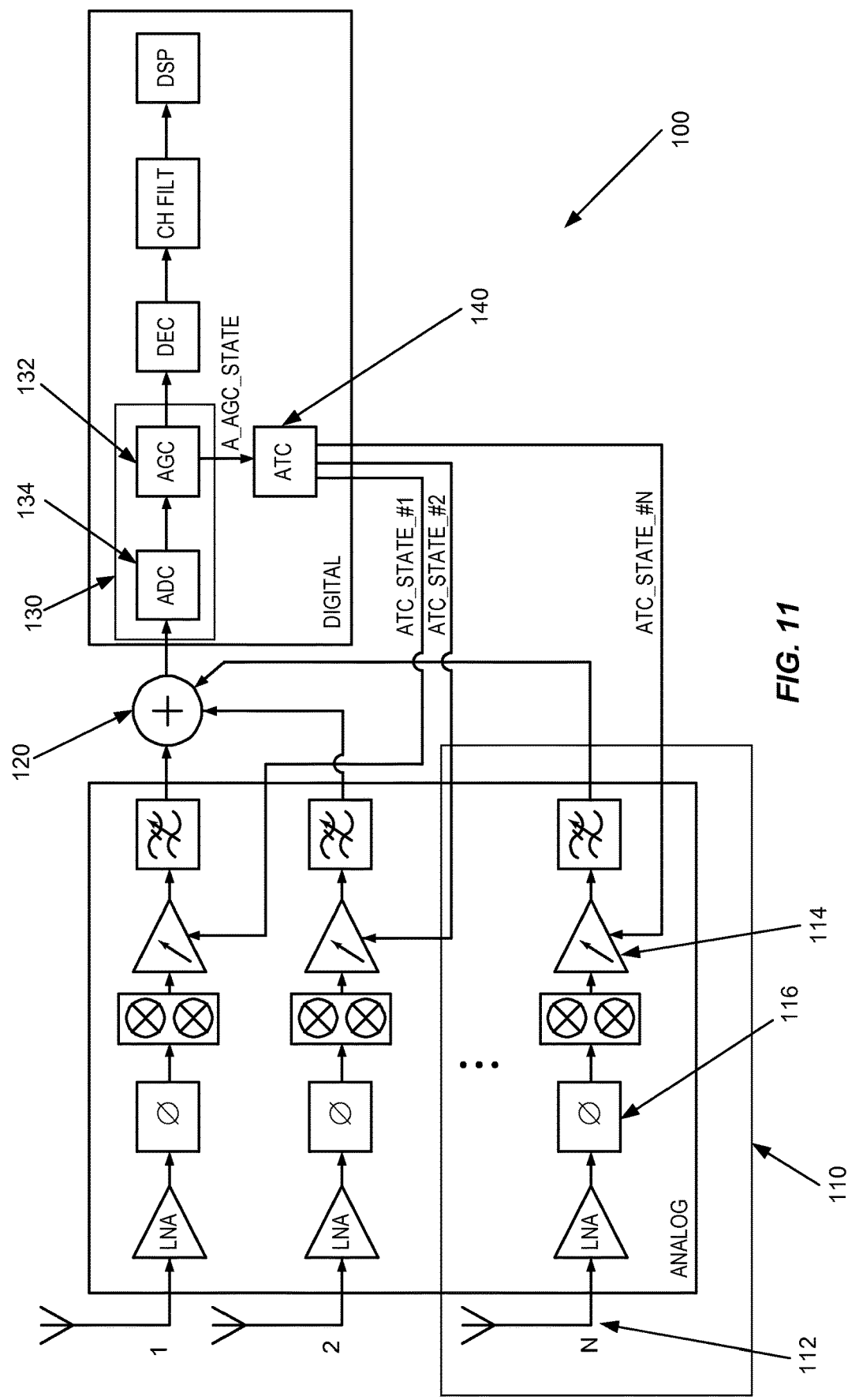
FIG. 11 shows a circuit diagram of a receiver according to one exemplary embodiment.

FIG. 11 shows a more detailed block diagram for a receiver 100 according to one exemplary embodiment. As shown in FIG. 11, receiver 100 includes a plurality of receiver block circuits 110, where for clarity purposes, only one of the receiver block circuits 110 and the elements included therein are labeled, where like elements have like numbers in both FIGS. 4 and 11. While FIG. 11 does not explicitly identify any edge antenna elements or edge receiver block circuits, it will be appreciated that any of the antenna elements, and thus any of the receiver block circuits, may be edge antenna elements/receiver block circuits as previously discussed. In this embodiment, the interference control circuit 140 comprises an Automatic Tapering Control (ATC) circuit 140 configured to implement the gain/tapering patterns discussed herein. In addition, FIG. 11 shows a phase control device 116 in each receiver block circuit 110, which serves to control a phase shift/time delay for each antenna element 112 to enable beamforming of the transmitted and/or received signal. Such beamforming helps increase capacity and coverage for the receiver 100. It will be appreciated that if the receiver 100 uses digital beamforming, the phase control device will be implemented after the received signal is digitizes, which generally requires an ADC in each receiver block circuit 110 (not shown). For the embodiment shown in FIG. 11, the ATC 140 may pass the gain control supplied by the gain control circuit 130 directly to the corresponding VGA 114, or may reduce the gain dictated by the AGC gain control as disclosed here for the VGAs 114 of the edge receiver block circuits $110_{edge}$.

The solution presented herein provides multiple advantages over known gain control/interference suppression techniques. First, by using spatial selectivity (i.e., applying the additional gain control only to the edge receiver block circuits $110_{edge}$), the solution suppresses the sidelobes and thus provides high suppression of the blocking signal(s). Further, when compared to traditional AGC, where the gain is controlled the same for all receiver block circuits 110, the solution presented herein provides a low loss of signal-to-noise plus distortion ratio (SINAD) for the wanted signal. Further, the tapering/reduction of the gain is only applied responsive to the combined signal, e.g., to the power of the combined signal, and thus is only applied when needed. Further still, some embodiments provide a fast response to the presence of the blocking signal because only some receiver block circuits need the additional control, e.g., only the edge receiver block circuits need to be deactivated, which may be implemented by adding a simple on/off switch.

The solution presented herein is generally described in terms of various circuits, e.g., receiver block circuits 110, a gain control circuit 130, an interference control circuit 140, etc. The apparatuses described herein may perform the solution/methods described herein, and any other processing, by implementing any functional means, modules, units, or circuitry. In one embodiment, for example, the apparatuses comprise respective circuits or circuitry configured to perform the steps shown in the method figures. The circuits or circuitry in this regard may comprise circuits dedicated to performing certain functional processing and/or one or more microprocessors in conjunction with memory. For instance, the circuitry may include one or more microprocessor or microcontrollers, as well as other digital hardware, which may include digital signal processors (DSPs), special-purpose digital logic, and the like. The processing circuitry may be configured to execute program code stored in memory, which may include one or several types of memory such as read-only memory (ROM), random-access memory, cache memory, flash memory devices, optical storage devices, etc. Program code stored in memory may include program instructions for executing one or more telecommunications and/or data communications protocols as well as instructions for carrying out one or more of the techniques described herein, in several embodiments. In embodiments that employ memory, the memory stores program code that, when executed by the one or more processors, carries out the techniques described herein.

Figure 12:
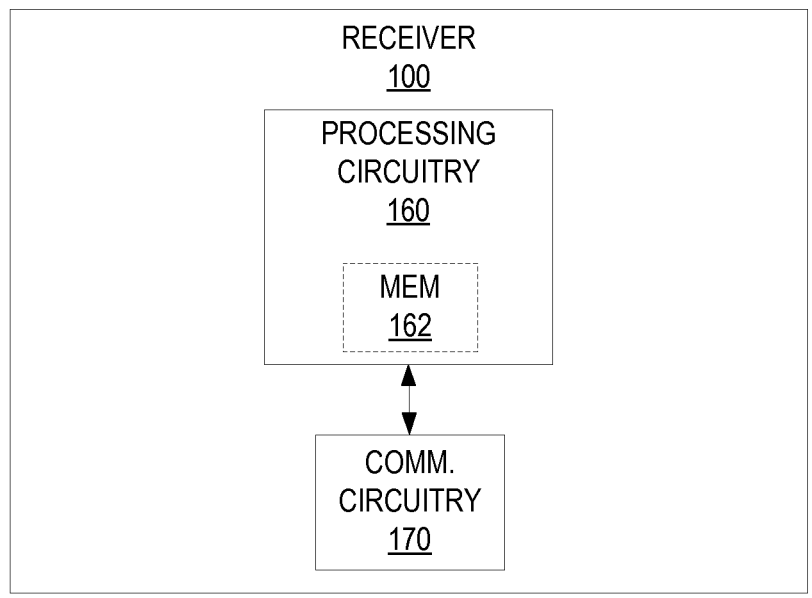
FIG. 12 shows a block diagram of a receiver according to another exemplary embodiment.

FIG. 12 for example shows a receiver 100 as implemented in accordance with one or more embodiments. As shown, the receiver 100 includes processing circuitry 160 and communication circuitry 170. The communication circuitry 170 (e.g., radio circuitry) is configured to receive information from one or more other nodes, e.g., via any communication technology. Such communication may occur via one or more antennas, e.g., antenna array 150. The processing circuitry 160 is configured to perform processing described above, such as by executing instructions stored in memory 162. The processing circuitry 160 in this regard may implement certain functional means, units, or modules.

Those skilled in the art will also appreciate that embodiments herein further include corresponding computer programs. A computer program comprises instructions which, when executed on at least one processor of an apparatus, cause the apparatus to carry out any of the respective processing described herein. A computer program in this regard may comprise one or more code modules corresponding to the means, units, or circuits described herein.

Embodiments further include a carrier containing such a computer program. This carrier may comprise one of an electronic signal, optical signal, radio signal, or computer readable storage medium.

In this regard, embodiments herein also include a computer program product stored on a non-transitory computer readable (storage or recording) medium and comprising instructions that, when executed by a processor of an apparatus, cause the apparatus to perform as described herein.

Embodiments further include a computer program product comprising program code portions for performing the steps of any of the embodiments herein when the computer program product is executed by a computing device. This computer program product may be stored on a computer readable recording medium.

The solution presented herein may be implemented in any wireless node, including but not limited to a wireless device (WD) or network node.

As used herein, wireless device (WD) refers to a device capable, configured, arranged and/or operable to communicate wirelessly with network nodes and/or other wireless devices. Unless otherwise noted, the term WD may be used interchangeably herein with user equipment (UE). Communicating wirelessly may involve transmitting and/or receiving wireless signals using electromagnetic waves, radio waves, infrared waves, and/or other types of signals suitable for conveying information through air. In some embodiments, a WD may be configured to transmit and/or receive information without direct human interaction. For instance, a WD may be designed to transmit information to a network on a predetermined schedule, when triggered by an internal or external event, or in response to requests from the network. Examples of a WD include, but are not limited to, a smart phone, a mobile phone, a cell phone, a voice over IP (VoIP) phone, a wireless local loop phone, a desktop computer, a personal digital assistant (PDA), a wireless cameras, a gaming console or device, a music storage device, a playback appliance, a wearable terminal device, a wireless endpoint, a mobile station, a tablet, a laptop, a laptop-embedded equipment (LEE), a laptop-mounted equipment (LME), a smart device, a wireless customer-premise equipment (CPE), a vehicle-mounted wireless terminal device, etc. A WD may support device-to-device (D2D) communication, for example by implementing a 3GPP standard for sidelink communication, vehicle-to-vehicle (V2V), vehicle-to-infrastructure (V2I), vehicle-to-everything (V2X) and may in this case be referred to as a D2D communication device. As yet another specific example, in an Internet of Things (IoT) scenario, a WD may represent a machine or other device that performs monitoring and/or measurements, and transmits the results of such monitoring and/or measurements to another WD and/or a network node. The WD may in this case be a machine-to-machine (M2M) device, which may in a 3GPP context be referred to as an MTC device. As one particular example, the WD may be a UE implementing the 3GPP narrow band internet of things (NB-IoT) standard. Particular examples of such machines or devices are sensors, metering devices such as power meters, industrial machinery, or home or personal appliances (e.g. refrigerators, televisions, etc.) personal wearables (e.g., watches, fitness trackers, etc.). In other scenarios, a WD may represent a vehicle or other equipment that is capable of monitoring and/or reporting on its operational status or other functions associated with its operation. A WD as described above may represent the endpoint of a wireless connection, in which case the device may be referred to as a wireless terminal. Furthermore, a WD as described above may be mobile, in which case it may also be referred to as a mobile device or a mobile terminal.

As used herein, network node refers to equipment capable, configured, arranged and/or operable to communicate directly or indirectly with a wireless device and/or with other network nodes or equipment in the wireless network to enable and/or provide wireless access to the wireless device and/or to perform other functions (e.g., administration) in the wireless network. Examples of network nodes include, but are not limited to, access points (APs) (e.g., radio access points), base stations (BSs) (e.g., radio base stations, Node Bs, evolved Node Bs (eNBs) and NR NodeBs (gNBs)). Base stations may be categorized based on the amount of coverage they provide (or, stated differently, their transmit power level) and may then also be referred to as femto base stations, pico base stations, micro base stations, or macro base stations. A base station may be a relay node or a relay donor node controlling a relay. A network node may also include one or more (or all) parts of a distributed radio base station such as centralized digital units and/or remote radio units (RRUs), sometimes referred to as Remote Radio Heads (RRHs). Such remote radio units may or may not be integrated with an antenna as an antenna integrated radio. Parts of a distributed radio base station may also be referred to as nodes in a distributed antenna system (DAS). Yet further examples of network nodes include multi-standard radio (MSR) equipment such as MSR BSs, network controllers such as radio network controllers (RNCs) or base station controllers (BSCs), base transceiver stations (BTSs), transmission points, transmission nodes, multi-cell/multicast coordination entities (MCEs), core network nodes (e.g., MSCs, MMEs), O&M nodes, OSS nodes, SON nodes, positioning nodes (e.g., E-SMLCs), and/or MDTs. As another example, a network node may be a virtual network node as described in more detail below. More generally, however, network nodes may represent any suitable device (or group of devices) capable, configured, arranged, and/or operable to enable and/or provide a wireless device with access to the wireless network or to provide some service to a wireless device that has accessed the wireless network.

While the solution presented herein is described in terms of local area and wide area BSs, it will be appreciated that the solution presented herein applies to any scenario with a single blocking signal having one angle of arrival at the receiver 100 or to any scenario with multiple blocking signals having multiple angles of arrival at the receiver 100.

The solution presented herein may, of course, be carried out in other ways than those specifically set forth herein without departing from essential characteristics of the solution. The present embodiments are to be considered in all respects as illustrative and not restrictive, and all changes coming within the meaning and equivalency range of the appended claims are intended to be embraced therein.

What is claimed is:

1. A receiver configured to receive one or more wireless signals from one or more wireless devices via an antenna array comprising a plurality of antenna elements including a plurality of edge antenna elements at one or more outer edges of the antenna array, the receiver comprising:
 a plurality of receiver block circuits, each receiver block circuit comprising:
  an antenna element of the antenna array; and
  a variable gain amplifier configured to amplify a signal received by the corresponding antenna element to generate an amplified signal;
 a combiner configured to combine the amplified signals output by the plurality of receiver block circuits to generate a combined signal;
 a gain control circuit configured to set a gain for each of the variable gain amplifiers responsive to the combined signal; and
 an interference control circuit configured to control each receiver block circuit in a set of edge receiver block circuits responsive to the combined signal, said set of edge receiver block circuits comprising one or more receiver block circuits with at least one edge antenna element, and said set of edge receiver block circuits comprising fewer than the plurality of receiver block circuits.

2. The receiver of claim 1 wherein:
 the antenna array comprises a grid of the antenna elements comprising a corner antenna element in each corner of the grid; and
 the set of edge receiver block circuits comprises the receiver block circuits with the corner antenna elements.

3. The receiver of claim 1 wherein:
 the antenna array comprises a grid of the antenna elements comprising a plurality of corner antenna elements within each corner of the grid; and
 the set of edge receiver block circuits comprises the receiver block circuits with the plurality of corner antenna elements within each corner of the grid.

4. The receiver of claim 3 wherein at least one of the plurality of corner antenna elements within one corner of the grid is adjacent to at least one of the plurality of corner antenna elements within another corner of the grid.

5. The receiver of claim 1 wherein the interference control circuit controls each receiver block circuit in the set of edge receiver block circuits by deactivating each variable gain amplifier in the set of edge receiver block circuits when the power of the combined signal exceeds the threshold.

6. The receiver of claim 5 wherein the interference control circuit deactivates each variable gain amplifier in the set of edge receiver block circuits by setting the gain of each variable gain amplifier in the set of edge receiver block circuits to zero.

7. The receiver of claim 5 wherein the interference control circuit deactivates each variable gain amplifier in the set of edge receiver block circuits by turning off the power to each variable gain amplifier in the set of edge receiver block circuits.

8. The receiver of claim 1 wherein the interference control circuit controls each receiver block circuit in the set of edge receiver block circuits by deactivating each of the at least one edge antenna element in the set of edge receiver block circuits.

9. The receiver of claim 1 wherein the interference control circuit controls each receiver block circuit in the set of edge receiver block circuits by applying a tapering pattern to the variable gain amplifiers in the set of edge receiver block circuits, said tapering pattern defining a tapering of the gain set by the gain control circuit for each variable gain amplifier in the set of edge receiver block circuits.

10. The receiver of claim 9 wherein the interference control circuit is further configured to select the tapering pattern from a plurality of tapering patterns responsive to the combined signal.

11. The receiver of claim 1 wherein the gain control circuit comprises:
an analog-to-digital converter (ADC) operatively connected to the combiner and configured to convert the combined signal to a digital combined signal;
an automatic gain control (AGC) circuit operatively connected to the ADC and configured to set the gain for each of the variable gain amplifiers responsive to the digital combined signal;
wherein the interference control circuit controls each receiver block circuit in the set of edge receiver block circuits when the combined signal exceeds a dynamic range of the ADC.

12. The receiver of claim 1 wherein the receiver is comprised within a serving network node configured to serve wireless signals from one or more wireless devices within a network.

13. The receiver of claim 12 wherein the serving network node comprises a local area base station.

14. The receiver of claim 12 wherein the serving network node comprises a wide area base station or a medium range base station.

15. A method of receiving one or more wireless signals from one or more wireless devices via an antenna array comprising a plurality of antenna elements including a plurality of edge antenna elements at one or more of the outer edges of the antenna array, the method comprising:
processing a signal with a plurality of receiver block circuits by, for each receiver block circuit:
receiving the signal by an antenna element of the antenna array; and
amplifying the received signal using a variable gain amplifier to generate an amplified signal;
combining the amplified signals output by the plurality of receiver block circuits using a combiner to generate a combined signal;
setting a gain, using a gain control circuit, for each of the variable gain amplifiers responsive to the combined signal; and
controlling the processing of each receiver block circuit in a set of edge receiver block circuits responsive to the combined signal, said set of edge receiver block circuits comprising one or more receiver block circuits with at least one edge antenna element, and said set of edge receiver block circuits comprising fewer than the plurality of receiver block circuits.

16. The method of claim 15 wherein:
the antenna array comprises a grid of the antenna elements comprising a corner antenna element in each corner of the grid; and
the set of edge receiver block circuits comprises the receiver block circuits comprising the corner antenna elements.

17. The method of claim 15 wherein:
the antenna array comprises a grid of the antenna elements comprising a plurality of corner antenna elements within each corner of the grid; and
the set of edge receiver block circuits comprises the receiver block circuits with the plurality of corner antenna elements within each corner of the grid.

18. The method of claim 17 wherein at least one of the plurality of corner antenna elements within one corner of the grid is adjacent to at least one of the plurality of corner antenna elements within another corner of the grid.

19. The method of claim 15 wherein controlling each receiver block circuit in the set of edge receiver block circuits comprises deactivating each variable gain amplifier in the set of edge receiver block circuits when the power of the combined signal exceeds the threshold.

20. The method of claim 19 wherein deactivating each variable gain amplifier in the set of edge receiver block circuits comprises setting the gain of each variable gain amplifier in the set of edge receiver block circuits to zero.

21. The method of claim 19 wherein deactivating each variable gain amplifier in the set of edge receiver block circuits comprises turning off the power to each variable gain amplifier in the set of edge receiver block circuits.

22. The method of claim 15 wherein controlling each receiver block circuit in the set of edge receiver block circuits comprises deactivating each of the at least one edge antenna element in the set of edge receiver block circuits.

23. The method of claim 15 wherein controlling each receiver block circuit in the set of edge receiver block circuits comprises applying a tapering pattern to the variable gain amplifiers in the set of edge receiver block circuits, said tapering pattern defining a tapering of the gain set by the gain control circuit for each variable gain amplifier in the set of edge receiver block circuits.

24. The method of claim 23 further comprising selecting the tapering pattern from a plurality of tapering patterns responsive to the combined signal.

25. The method of claim 15 wherein:
the gain control circuit comprises an analog-to-digital converter (ADC) configured to convert the combined signal to a digital combined signal, and an automatic gain control (AGC) circuit operatively connected to the ADC and configured to set the gain for each of the variable gain amplifiers responsive to the digital combined signal;
controlling processing of each receiver block circuit in the set of edge receiver block circuits comprises controlling each receiver block circuit in the set of edge receiver block circuits when the combined signal exceeds a dynamic range of the ADC.

26. A non-transitory computer readable medium storing a computer program product for controlling a receiver, the computer program product comprising software instructions which, when run on at least one processing circuit in the receiver, causes the receiver to:
process a signal with a plurality of receiver block circuits by, for each receiver block circuit:
receiving the signal by an antenna element of the antenna array; and
amplifying the received signal using a variable gain amplifier to generate an amplified signal;
combine the amplified signals output by the plurality of receiver block circuits using a combiner to generate a combined signal;

set a gain, using a gain control circuit, for each of the variable gain amplifiers responsive to the combined signal; and control the processing of each receiver block circuit in a set of edge receiver block circuits responsive to the combined signal, said set of edge receiver block circuits comprising one or more receiver block circuits with at least one edge antenna element, and said set of edge receiver block circuits comprising fewer than the plurality of receiver block circuits.

27. A wireless node in a wireless network comprising:

an antenna array comprising a plurality of antenna elements including a plurality of edge antenna elements at one or more outer edges of the antenna array; and a receiver configured to receive one or more wireless signals from one or more wireless devices via the antenna array, the receiver comprising:

a plurality of receiver block circuits, each receiver block circuit comprising:

an antenna element of the antenna array; and a variable gain amplifier configured to amplify a signal received by the corresponding antenna element to generate an amplified signal;

a combiner configured to combine the amplified signals output by the plurality of receiver block circuits to generate a combined signal;

a gain control circuit configured to set a gain for each of the variable gain amplifiers responsive to the combined signal; and an interference control circuit configured to control each receiver block circuit in a set of edge receiver block circuits responsive to the combined signal, said set of edge receiver block circuits comprising one or more receiver block circuits with at least one edge antenna element, and said set of edge receiver block circuits comprising fewer than the plurality of receiver block circuits.

28. The wireless node of claim 27 wherein the wireless node comprises a user equipment.

29. The wireless node of claim 27 wherein the wireless node comprises a machine-to-machine device.

30. The wireless node of claim 27 wherein the wireless node comprises a network node.

\* \* \* \* \*